United States Patent
Gangasani

(10) Patent No.: US 10,770,137 B2
(45) Date of Patent: Sep. 8, 2020

(54) RESISTIVE MEMORY DEVICE INCLUDING COMPENSATION CIRCUIT

(71) Applicant: SAMSUNG ELECTRONICS CO., LTD., Suwon-si, Gyeonggi-Do (KR)

(72) Inventor: Venkataramana Gangasani, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/436,554

(22) Filed: Jun. 10, 2019

(65) Prior Publication Data

US 2019/0385678 A1  Dec. 19, 2019

(30) Foreign Application Priority Data

Jun. 15, 2018 (KR) .................. 10-2018-0068866

(51) Int. Cl.
*G11C 13/00* (2006.01)
*H01L 27/24* (2006.01)

(52) U.S. Cl.
CPC ........ *G11C 13/0026* (2013.01); *G11C 13/003* (2013.01); *G11C 13/004* (2013.01); *G11C 13/0028* (2013.01); *G11C 13/0069* (2013.01); *H01L 27/2436* (2013.01); *H01L 27/2463* (2013.01)

(58) Field of Classification Search
CPC ............ G11C 13/0026; G11C 13/0028; G11C 13/003; G11C 13/004; H01L 27/2436; H01L 27/2463

See application file for complete search history.

(56) References Cited

U.S. PATENT DOCUMENTS

| | | | |
|---|---|---|---|
| 6,839,279 B2 | 1/2005 | Yamada | |
| 6,944,077 B2 | 9/2005 | Morikawa | |
| 7,009,882 B2 | 3/2006 | Chen | |
| 7,245,526 B2 * | 7/2007 | Oh | G11C 7/12 365/163 |
| 7,248,494 B2 * | 7/2007 | Oh | G11C 7/12 365/148 |
| 7,436,723 B2 | 10/2008 | Rinerson et al. | |
| 7,483,302 B2 | 1/2009 | Hung et al. | |
| 8,102,729 B2 * | 1/2012 | Lee | G11C 8/08 365/148 |
| 8,159,858 B2 | 4/2012 | Siau | |

(Continued)

*Primary Examiner* — Tri M Hoang
(74) *Attorney, Agent, or Firm* — Volentine, Whitt & Francos, PLLC

(57) ABSTRACT

A memory device includes: a memory cell array, multiple bit lines, a compensation circuit, a holding circuit, and a control logic circuit. The memory cell array includes multiple memory cells. Each of the bit lines is connected to at least one of the memory cells. Among the bit lines, a predetermined voltage is applied to selected bit lines connected to selected memory cells. The compensation circuit includes a sampling circuit that generates a sampling value by sensing a leakage current applied to non-selected memory cells from among the plurality of memory cells. The holding circuit compensates for a voltage applied to the selected bit lines, based on the sampling value. The control logic circuit outputs a sampling-enable signal that controls enabling of the sampling circuit and a holding-enable signal that controls enabling of the holding circuit.

20 Claims, 16 Drawing Sheets

(56) References Cited

U.S. PATENT DOCUMENTS

| | | |
|---|---|---|
| 8,270,240 B2 | 9/2012 | Lin et al. |
| 8,305,796 B2 | 11/2012 | Chevallier et al. |
| 8,310,858 B2 | 11/2012 | Ito |
| 8,848,426 B2 | 9/2014 | Azuma et al. |
| 8,934,295 B1 | 1/2015 | Chen et al. |
| 9,123,430 B2 | 9/2015 | Cernea |
| 9,361,994 B1 | 6/2016 | Kouznetsov |
| 9,646,685 B2 * | 5/2017 | Park .................. G11C 13/0021 |
| 9,679,642 B2 | 6/2017 | Liu et al. |
| 2019/0198098 A1 * | 6/2019 | Yang .................. G11C 13/0038 |

* cited by examiner

RESISTIVE MEMORY DEVICE INCLUDING COMPENSATION CIRCUIT

CROSS-REFERENCE TO RELATED APPLICATION

This U.S. non-provisional patent application claims priority under 35 U.S.C. § 119 to Korean Patent Application No. 10-2018-0068866, filed on Jun. 15, 2018 in the Korean Intellectual Property Office, the disclosure of which is incorporated herein in its entirety by reference.

BACKGROUND

1. Technical Field

The present disclosure relates to a resistive memory device and a memory system including the same. More particularly, the present disclosure relates to a memory device that includes a compensation circuit, and a memory system including the memory device.

2. Description of the Related Art

Demand exists for memory devices with high volume and lower power. Accordingly, a next-generation memory device that does not need to be refreshed has been studied. The next-generation memory device may require high integration of dynamic random-access memory (DRAM), non-volatility of a flash memory, and a high speed of static RAM (SRAM). Phase change RAM (PRAM), Nano-Floating Gate Memory (NFGM), Polymer RAM (PoRAM), Magnetic RAM (MRAM), ferroelectric RAM (FeRAM), resistive RAM (RRAM), and the like, are brought up as next-generation memory devices to fulfill the aforementioned requirements.

SUMMARY

The present disclosure describes a memory device that includes a compensation circuit and a memory system that includes the memory device. More particularly, the present disclosure describes a memory device that includes a compensation circuit which compensates for a voltage drop due to a leakage current flowing through non-selected memory cells.

According to an aspect of the present disclosure, a memory device includes: a memory cell array, multiple bit lines, a compensation circuit, and a control logic circuit. The memory cell array includes multiple memory cells. Each of the bit lines is connected to at least one of the memory cells, and among the bit lines, a predetermined voltage is applied to selected bit lines that are connected to selected memory cells. The compensation circuit includes a sampling circuit that generates a sampling value by sensing a leakage current that is applied to non-selected memory cells from among the memory cells, and a holding circuit that compensates for a voltage applied to the selected bit lines, based on the sampling value. The control logic circuit outputs a sample-enable signal that controls enabling of the sampling circuit and a holding-enable signal that controls enabling of the holding circuit.

According to another aspect of the present disclosure, a resistive memory device includes a memory cell array, multiple bit lines, a control logic circuit, and a compensation circuit. The memory cell array includes multiple word lines, multiple bit lines and multiple memory cells. The control logic circuit outputs a row address for the word lines, based on an address received from an external device. The compensation circuit includes a sampling circuit, a holding circuit, and a switch. The sampling circuit generates a sampling value by sensing a leakage current that is applied to bit lines connected to selected memory cells in which memory operations are performed, from among the memory cells. The holding circuit holds the sampling value and compensates, based on the sampling value, for a voltage that is applied to the bit lines connected to the selected memory cells. The switch has an end connected to the sampling circuit and another end connected to the holding circuit.

According to another aspect of the present disclosure, a resistive memory device includes a memory cell array, bit lines, and a compensation circuit. The memory cell array includes multiple memory cells arranged along rows and columns. The bit lines include multiple local bit lines respectively connected to the memory cells and multiple global bit lines connected to at least one of the local bit lines via a local-selected transistor. The compensation circuit includes a sampling circuit and a holding circuit. The sampling circuit generates a sampling value by sensing a leakage current that is applied to a bit line connected to selected memory cells in which a memory operation or memory operations is/are performed, from among the memory cells. The holding circuit compensates for a voltage applied to the bit line that is connected to the selected memory cells, based on the sampling value.

BRIEF DESCRIPTION OF THE DRAWINGS

Embodiments of the present disclosure will be more clearly understood from the following detailed description taken in conjunction with the accompanying drawings in which.

DETAILED DESCRIPTION OF THE EMBODIMENTS

The inventive concept(s) of the present disclosure now will be described more fully hereinafter with reference to the accompanying drawings.

Figure 1:
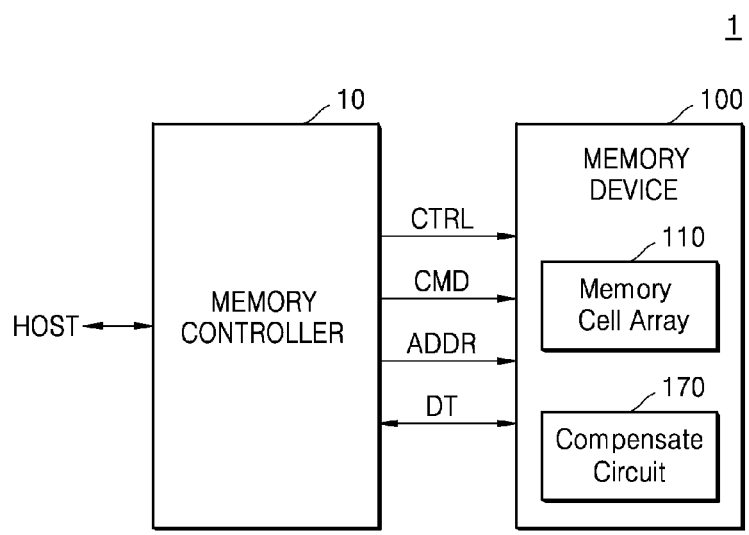
FIG. 1 is a block diagram illustrating a memory system according to an example embodiment.

FIG. 1 is a block diagram illustrating a memory system according to an example embodiment.

Referring to FIG. 1, a memory system 1 may include a memory controller 10 and a memory device 100. The memory device 100 may include a memory cell array 110 and a compensate circuit 170. The compensate circuit 170 is representative of, and may also be known or referred to herein, as a compensation circuit.

In FIGS. herein including FIG. 1, circuitry may be shown as, for example, a "memory controller", "control logic", a "voltage generator" and a "processor". As is traditional in the field of the inventive concept(s) described herein, examples may be described and illustrated in terms of blocks which carry out a described function or functions. These blocks, which may be referred to herein as a memory controller, control logic, a voltage generator, a circuit, a processor, or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the examples may be physically separated into two or more interacting and discrete blocks without departing from the scope of the inventive concepts. Likewise, the blocks of the examples may be physically combined into more complex blocks without departing from the scope of the inventive concepts.

The memory controller 10 may, in response to read/write requests from a host HOST, control the memory device 100 to write data to the memory device 100 or read data stored in the memory device 100. More particularly, the memory controller 10 may control program (or write), read, and erase operations with respect to the memory device 100, by providing an address ADDR, a command CMD, and a control signal CTRL to the memory device 100. In addition, data DT to be written and read data DT may be transmitted and received between the memory controller 10 and the memory device 100. For example, when memory cells are arranged in the memory cell array 110 in rows and columns, the address ADDR may include a row address and a column address.

Although not shown in FIG. 1, the memory controller 10 may further include random-access memory (RAM), a processor, a host interface, and a memory interface. The RAM may be used as an operation memory of the processor, and the processor may control operations of the memory controller 10. The host interface may include a protocol for performing data exchange between the host HOST and the memory controller 10. For example, the memory controller 10 may be configured to communicate with the outside (for example, a host) by using at least one of various interface protocols including universal serial bus (USB), multi-media card (MMC), peripheral component interconnect express (PCI-E), advanced technology attachment (ATA), serial-ATA, parallel-ATA, small computer small interface (SCSI), enhanced small disk interface (ESDI), integrated drive electronics (IDE), and the like.

The memory cell array 110 may include multiple memory cells (not shown) that are respectively arranged in areas in which multiple first signal lines and multiple second signal lines cross one another. In an example embodiment, the first signal lines may be multiple word lines, and the second signal lines may be multiple bit lines. In another example embodiment, the first signal lines may be multiple bit lines, and the second signal lines may be multiple word lines. The memory device 100 including the memory cell array 110 may be referred to as a cross-point memory device.

Figure 4:
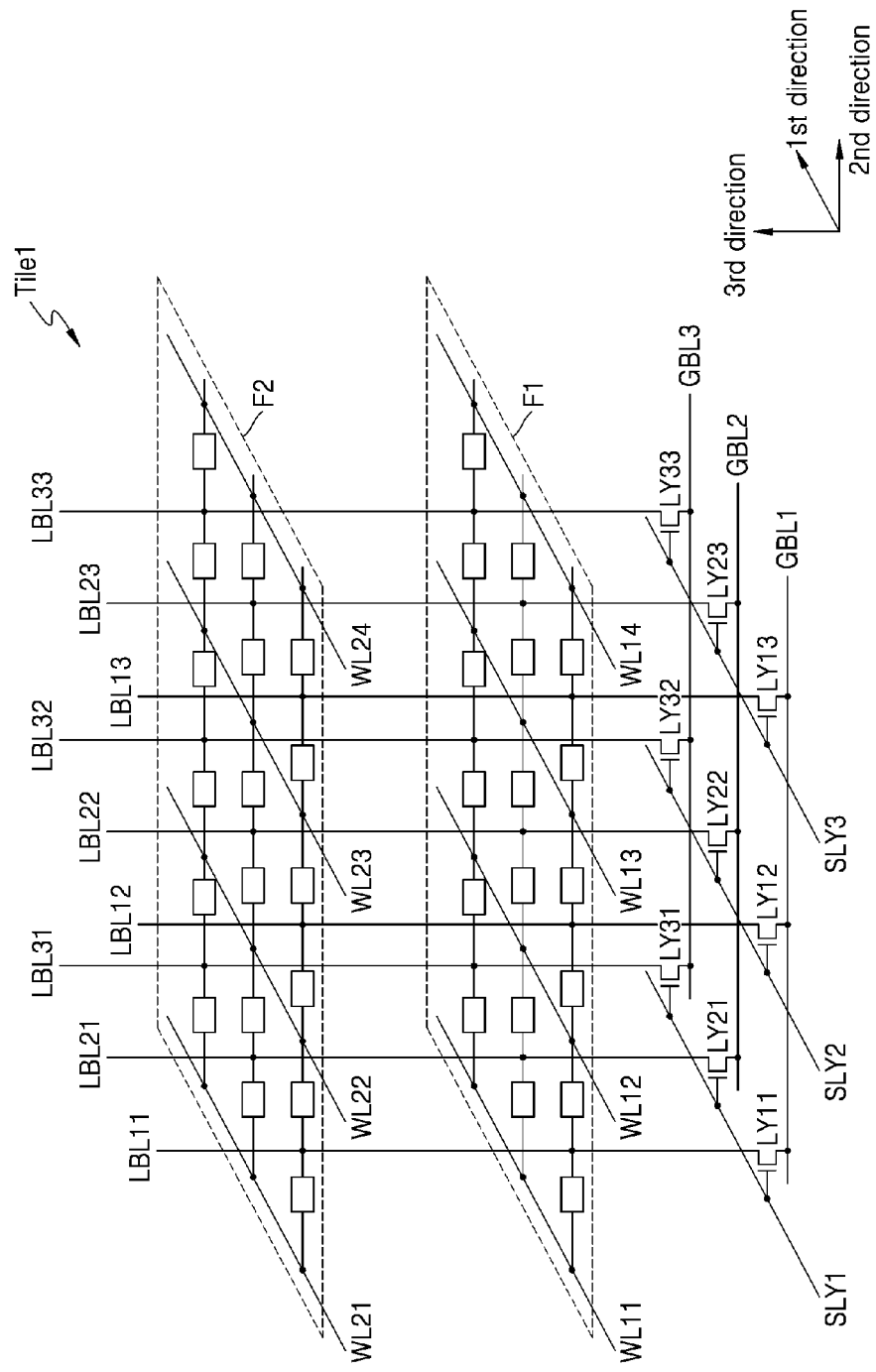
FIG. 4 is a circuit diagram illustrating an example embodiment of a tile shown in FIG. 3.

In an example embodiment, each of the bit lines may include a global bit line and at least one local bit line. For example, each bit line may include a global bit line and at least one local bit line that is electrically connected to the global bit line via a local-selected transistor. An example of what is meant by a bit line including a global bit line and at least one local bit line is illustrated in FIG. 4, wherein global bit lines GBL1, GBL2 and GBL3 are arranged horizontally on the page and connected to multiple local bit lines in groups of LBL11/LBL12/LBL13, LBL21/LBL22/LBL23, LBL31/LBL32/LBL33 which are arranged vertically on the page. Each combination of a global bit line and one or more connected local bit lines may be considered an individual bit line, though even a combination of a single global bit line and a single connected local bit line may be referred to in the plural as "bit lines" also.

In an example embodiment, the global bit line may be connected to the compensate circuit 170 through a global-selected transistor. For example, when a bit line is selected, the global-selected transistor and a local-selected transistor may be turned on. The memory cells may respectively be connected to the at least one local bit line.

The memory cell array 110 may include multiple memory cells arranged in rows and columns. In the embodiment, the memory cells may include resistive memory cells each including a variable resistance device (not shown). For example, when the variable resistance device is a phase-change material (GST, Ge—Sb—Te) which has a resistance that varies according to temperatures, the memory device 100 may be a phase-change random-access memory (PRAM). As another example, when the variable resistance device includes an upper electrode, a lower electrode, and a complex metal oxide therebetween, the memory device 100 may be resistive random-access memory (RRAM). As another example, when the variable resistance device includes a magnetic upper electrode, a magnetic lower electrode, and a dielectric therebetween, the memory device 100 may be magnetic random-access memory (MRAM). Accordingly, the memory device 100 may be referred to as a resistive memory device, and the memory system 1 may be referred to as a resistive memory system.

In an example embodiment, each of the memory cells may be a single level cell (SLC) storing 1-bit data. In this case, the memory cells may have two resistance distributions according to data stored in the memory cells. In another example embodiment, each of the memory cells may be a multi level cell (MLC) that may store 2-bit data. In this case, the memory cells may have four resistance distributions according to data stored in the memory cells. In another example embodiment, each of the memory cells may be a triple level cell (TLC) that may store 3-bit data. In this case, the memory cells may have eight resistance distributions according to data stored in the memory cells. However, the present disclosure is not limited thereto, and in another embodiment, the memory cell array 110 may include memory cells that may respectively store data equal to or greater than 4 bits. In addition, the memory cell array 110 may include SLCs, MLCs, and TLCs altogether.

The compensate circuit 170 may, for example, be a circuit used for compensating for a voltage drop due to a leakage current generated due to non-selected memory cells when applying a voltage to selected bit lines. In an example embodiment, the compensate circuit 170 may sense a leakage current that is applied to the non-selected memory cells (i.e., memory cells other than the selected memory cells among the memory cells). Based on a result of the sensing, the compensate circuit 170 may also apply the leakage current or a voltage corresponding to the leakage current to the selected bit lines. Based on the compensation operation of the compensate circuit 170, a target voltage (for example, a clamping voltage) may be more accurately applied to the selected memory cells that are connected to the selected bit lines. In addition, by compensating for the leakage current caused by the non-selected memory cells, it is possible to reduce deviation between voltages to be respectively applied to the selected memory cells.

In the specification, the selected memory cells may indicate memory cells on which memory operations such as write, read, and/or erase are performed. The non-selected memory cells may indicate memory cells other than the selected memory cells from among the memory cells.

The memory controller 10 and the memory device 100 may be integrated into one semiconductor device. For example, the memory controller 10 and the memory device 100 may be integrated into one semiconductor device and form a memory card. For example, the memory controller 10 and the memory device 100 may be integrated into one semiconductor device and form a personal computer memory card (PCMCIA), a CompactFlash (CF) card, a smart media card (SM/SMC), a memory stick, a universal flash storage (UFS), a multi-media card (MMC) and the like. Examples of a multi-media card include a reduced-size multi-media card (RS-MMC), an MMCmicro (a micro-size version of MMC), or an SD card (SD). Examples of an SD card include a miniSD and a microSD. As another example, the memory controller 10 and the memory device 100 may be integrated into one (i.e., the same) semiconductor device and form a solid-state disk/drive (SSD).

Figure 2:
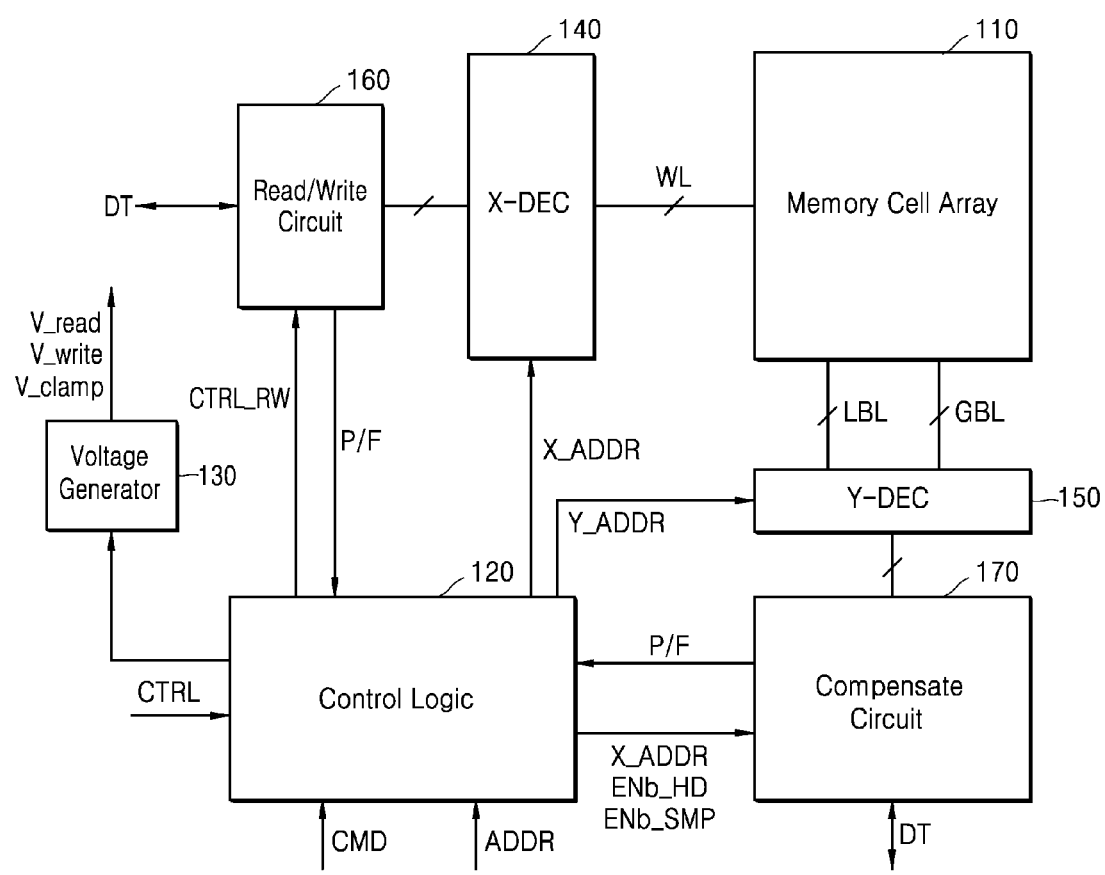
FIG. 2 is a block diagram illustrating a memory device according to an example embodiment.

FIG. 2 is a block diagram of the memory device according to an example embodiment. FIG. 2 may, for example, be a detailed block diagram illustrating the memory device 100 of FIG. 1.

Referring to FIG. 2, the memory device 100 may include the memory cell array 110, a control logic 120 (control logic circuit), a voltage generator 130, a row decoder 140, a column decoder 150, a read/write circuit 160, and a compensate circuit 170. Hereinafter, the components included in the memory device 100 will be described in detail.

The memory cells included in the memory cell array 110 may be connected to the first signal lines and the second signal lines. In an example embodiment, the first signal lines may be word lines WLs, and the second signal lines may be local bit lines LBLs and global bit lines GBLs. Various kinds of voltage signals or current signals are provided via multiple word lines WLs and multiple bit lines BLs. Accordingly, data DT is written to or read from the selected memory cells, and write or read operations may be prevented with respect to the non-selected memory cells.

The address ADDR to indicate an access target memory cell may be received along with the command CMD. The address ADDR may include a row address X_ADDR to select the word lines WLs of the memory cell array 110 and a column address Y_ADDR to select the local bit lines LBLs and the global bit lines GBLs of the memory cell array 110. The address ADDR provided to the memory device 100 may correspond to a physical address PA that is converted from a logical address LA received from the host HOST in the memory system 1. The row decoder 140 may perform an operation of selecting the word lines WLs in response to the row address X_ADDR. The column decoder 150 may perform an operation of selecting the bit lines BLs in response to the column address Y_ADDR. Each of the bit lines BLs may include the global bit line GBL and the local bit line LBL. Although each of the bit lines BLs is described as including the global bit line GBL and the local bit line LBL, the bit lines BLs are not limited thereto.

The control logic 120 (control logic circuit) may output various control signals CTRL_RW to write data DT to or read data DT from the memory cell array 110, based on the command CMD, the address ADDR, and the control signal CTRL received from the memory controller 10. By doing so, the control logic 120 (control logic circuit) may control various operations performed in the memory device 100.

In an example embodiment, the control logic 120 (control logic circuit) may output the row address X_ADDR to the compensate circuit 170. For example, the compensate circuit 170 may include a variable resistor for sampling of the leakage current. A resistance of the variable resistor may vary according to the row address X_ADDR. For example, the variable resistor included in the compensate circuit 170 may, based on the row address X_ADDR, vary to have a resistance that is the same as that of the local bit line LBL.

Furthermore, in an example embodiment, the control logic 120 (control logic circuit) may output a sampling-enable signal ENb_SMP and a holding-enable signal ENb_HD to the compensate circuit 170. For example, the compensate circuit 170 may perform a sampling operation, based on the sampling-enable signal ENb_SMP, and perform holding and compensation operation, based on the holding-enable signal ENb_HD.

The voltage generator 130 may generate a write voltage V_write that is used for a write operation and a read voltage V_read that is used for a read operation. The write voltage V_write may include a set voltage, a reset voltage, and the like, as various kinds of voltages regarding the write operation. The write voltage V_write and the read voltage V_read may be provided to the global bit lines GBLs and the local bit lines LBLs via the column decoder 150, or may be provided to the word lines WLs via the row decoder 140.

The voltage generator 130 may further generate a clamping voltage V_clamp to be applied to the selected bit lines. The clamping voltage V_clamp may be a voltage for clamping the bit line, to which the selected memory cells are connected, at an appropriate level. The clamping voltage V_clamp may have various patterns. For example, the clamping voltage V_clamp may increase according to time, and a stepped pattern thereof may also increase according to time.

Although it is not shown, a reference signal generator may be further provided for generating a reference voltage for data identification. For example, to identify data that is written to a memory cell, a voltage of a node (for example, a sensing node) of the local bit line LBL and the reference voltage, which is generated from the reference generator, may be compared to each other. Alternatively, when a current sensing method is adopted, the reference signal generator may generate a reference current and provide the reference current to the memory cell array 110. The data value may be identified by comparing the reference voltage to a voltage of a sensing node based on the reference current.

The read/write circuit 160 may be connected to the memory cell array 110 via the first signal lines and/or the second signal lines. The read/write circuit 160 may write data DT to or read data DT from the memory cells. In addition, the read/write circuit 160 may provide a pass/fail signal P/F, according to a result of identifying the read data, to the control logic 120 (control logic circuit). The control logic 120 (control logic circuit) may control writing and reading operations of the memory cell array 110 with reference to the pass/fail signal P/F.

Although it is illustrated that the read/write circuit 160 is connected to the word lines WL via the row decoder 140, the read/write circuit 160 may also be connected to the local bit line LBL and the global bit line GBL via the column decoder 150.

The compensate circuit 170 may be connected to the local bit line LBLs and/or the global bit line GBLs. The compensate circuit 170 may compensate for fluctuation of currents (or voltages) to be applied to the selected memory cells, based on a leakage current that is applied to the non-selected memory cells from among the memory cells. In an example embodiment, the compensate circuit 170 may include a sampling circuit for generating a sampling value that is a value generated by sensing the leakage current applied to the non-selected memory cells and a holding circuit that holds the sampling value and compensates for the voltages that are applied to the selected bit lines, based on the sampling value that is held. For example, the sampling value may be sensed based on information on the leakage current and information on the variable resistor. In other words, the sampling circuit may track the leakage current that is applied to the non-selected memory cells, and the holding circuit may apply a current (or a voltage), which is compensated for based on the leakage current that has been tracked, to the selected bit line. In an example embodiment, the sampling circuit and the holding circuit are connected to each other via a switch, and may transmit and receive a sampling value, based on when the switch is turned on and turned off.

For example, the compensate circuit 170 may perform sampling on the leakage current that is applied to the non-selected memory cells, in response to the sampling-enable signal ENb_SMP. In addition, the compensate circuit 170 may hold the sampling value of the leakage current, in response to the holding-enable signal ENb_HD. The compensate circuit 170 may perform the compensation operation based on the sampling value that is held. Details thereof will be described later.

Figure 3:
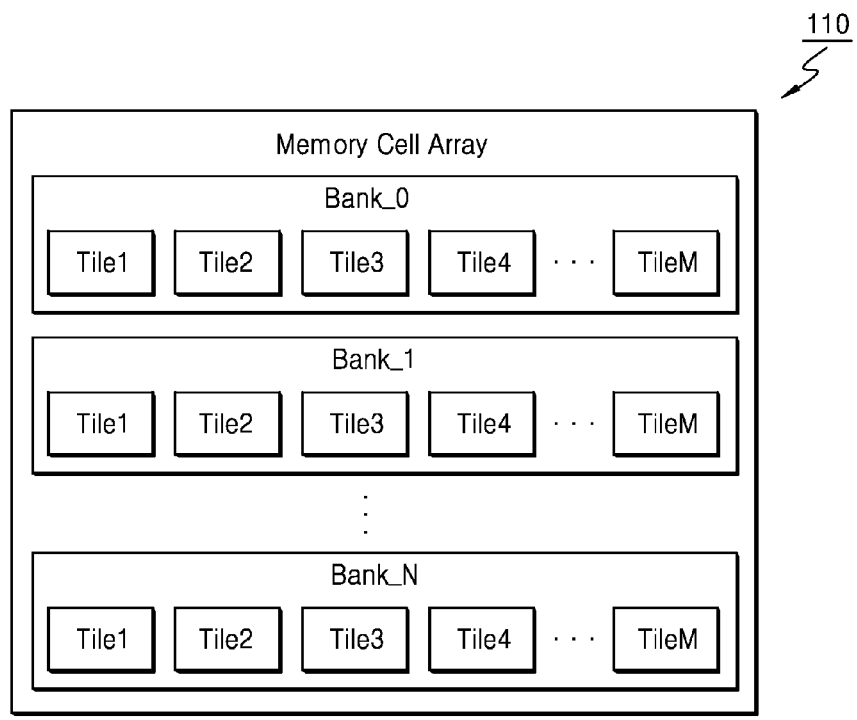
FIG. 3 illustrates a detailed configuration of a memory cell array shown in FIG. 2.

FIG. 3 illustrates a detailed configuration of the memory cell array 110 shown in FIG. 2.

Referring to FIG. 3, the memory cell array 110 may include multiple banks Bank_0 through Bank_N. The banks Bank_0 through Bank_N may be arranged in the memory cell array 110 in one direction. Each of the banks Bank_0 through Bank_N may include multiple tiles Tile1 through TileM. For example, a bank may be a unit including the tiles Tile1 through TileM, and a tile may be a unit including multiple memory cells. Although units of banks and tiles are shown for convenience of explanation, configuration of the banks and the tiles is not limited thereto. For example, the bank may be sorted into multiple region units, the region may be sorted into multiple bay units, and the bay may be sorted into the tile units.

FIG. 4 is a circuit diagram illustrating an example embodiment of a tile shown in FIG. 3. For example, a tile Tile1 may be a resistive memory having a three-dimensional structure including multiple layers F1 and F2, and each of the tiles Tile1 through TileM shown in FIG. 3 may be implemented as shown in FIG. 4. The tile Tile1 may include multiple global bit lines GBL1 through GBL3, multiple local bit lines LBL11 through LBL33, multiple local bit line selecting lines SLY1 through SLY3, and multiple word lines WL11 through WL24. The tile Tile1 may further include multiple memory cells MCs and multiple local-selected transistors LY11 through LY33. The number of global bit lines, the number of local bit lines, the number of local bit line selecting lines, the number of word lines, the number of memory cells, and the number of local-selecting transistors may vary according to embodiments. In addition, although the resistive memory having the three-dimensional structure is described in the embodiment, one of ordinary skill in the art will appreciate that the present disclosure is not limited thereto.

The global bit lines GBL1 through GBL3 are arranged away from one another in a first direction and may extend in a second direction. The global bit lines GBL1 through GBL3 may respectively be connected to the local bit lines LBL11 through LBL33 via the local-selected transistors LY11 through LY33. For example, an end (for example, a source end) of the local-selected transistor LY11 may be connected to the global bit line GBL1. Another end (for example, a drain end) of the local-selected transistor LY11 may be connected to the local bit line LBL11.

The local bit line selecting lines SLY1 through SLY3 may be arranged away from one another at certain intervals in the second direction and may extend in the first direction. The local bit line selected lines SLY1 through SLY3 may be connected to gate ends of the local selected transistors LY11 through LY33. For example, the local bit line selected line SLY may be connected to the gate ends of the local-selected transistors LY11, LY21, and LY31.

The local bit lines LBL11 through LBL33 may be arranged away from one another at certain intervals respectively in the first and second directions and may extend in a third direction. In addition, the word lines WL11 through WL24 may, having the local bit lines LBL11 through LBL33 therebetween, be arranged away from one another in the second direction and may extend in the first direction. For example, the local bit lines LBL11, LBL21, and LBL31 may be arranged between the word lines WL11 and WL12 or between the word lines WL21 and WL22.

An end of each of the memory cells MCs may be connected to a word line. Another end of each of the memory cells MCs may be connected to the local bit line. Accordingly, a write current (or voltage) or a read current (or voltage) may be applied to each of the memory cells MC via the bit line or the word line connected to each of the memory cells MC.

Figure 5A:
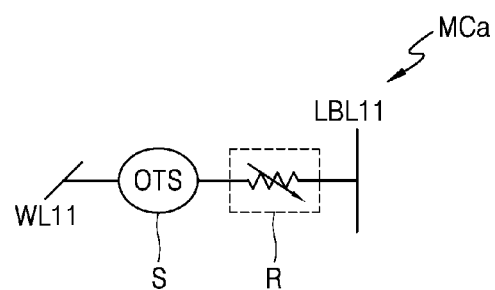
FIGS. 5A through 5C are circuit diagrams respectively illustrating example embodiments of a memory cell shown in FIG. 4.
Figure 5B:
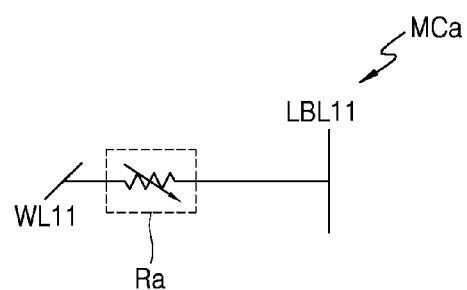
Figure 5C:
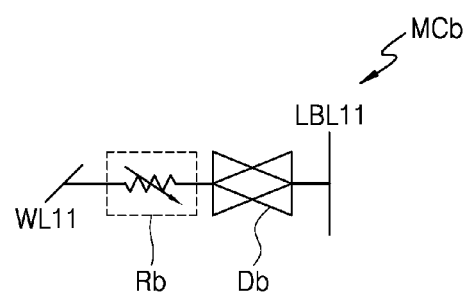

FIGS. 5A through 5C are circuit diagrams respectively illustrating example embodiments of the memory cell shown in FIG. 4.

Referring to FIG. 5A, the memory cell MC may include a variable resistive device R and a selected device S. In the embodiment, the variable resistive device R may be referred to as a variable resistor (or a variable resistive material), and the selected device S may be referred to as a switching device.

In an embodiment, the variable resistive device R may be connected to the local bit line LBL11 and the selected device S. The selected device S may be connected to the variable resistive device R and the word line WL11. However, the aforementioned devices are not limited thereto, and alternatively, the selected device S may be connected to the local bit line LBL11 and the variable resistive device R, and the variable resistive device R may be connected to the selected device S and the word line WL11.

The variable resistive device R may be changed to have one of multiple resistance states in response to an electrical pulse that is applied to the variable resistive device R. According to an example embodiment, the variable resistive device R may include a phase-change material having a crystalline state that varies according to an amount of a current. Various kinds of materials may be used as the phase-change material, for example, GaSb, InSb, InSe, Sb2Te3, GeTe, which are generated by combining two elements, GeSbTe, GaSeTe, InSbTe, SnSb2Te4, InSbGe, which are generated by combining three elements, AgInSbTe, (GeSn)SbTe, GeSb(SeTe), Te81Ge15Sb2S2, which are generated by combining four elements, and the like.

The phase-change material may have an amorphous state having a relatively high resistance and a crystal state having a relatively low resistance. The phase of the phase-change material may be changed due to Joule's heat that is generated according to the amount of the current. In addition, the aforementioned phase-change may be used to write data.

In another embodiment, the variable resistive device R may, instead of the phase-change material, include perovskite compounds, a transition metal oxide, magnetic materials, ferromagnetic materials, or antiferromagnetic materials.

The selected device S may control a current supply to the variable resistive device R, according to a voltage applied to the word line WL11 connected to the selected device S. The selected device S may be an Ovonic Threshold Switch (OTS) including a chalcogenide compound. The OTS may be formed of materials including at least one of arsenic (AS), germanium (Ge), selenium (Se), tellurium (Te), silicon (Si), bismuth (Bi), sodium (S), and stibium (Sb). Particularly, the OTS may be formed of a material included in 6-element system, the material being formed by adding selenium (Se) and sulfur (S) to a compound including germanium (Ge), silicon (Si), arsenic (As), and tellurium (Te).

Referring to FIG. 5B, a memory cell MCa may include a variable resistive device Ra, and the variable resistive device Ra may be connected to the local bit line LBL11 and the word line WL11. The memory cell MCa may store data by using voltages applied respectively to the local bit line LBL11 and the word line WL11.

Referring to FIG. 5C, a memory cell MCb may include a variable resistive device Rb and a bidirectional diode Db. The variable resistive device Rb may include a resistive material used for storing data. The bidirectional diode Db may be connected to the variable resistive device Rb and the local bit line LBL11. The variable resistive device Rb may be connected to the word line WL11 and the bidirectional diode Db. Positions of the bidirectional diode Db and the variable resistive device Rb may be changed with each other. Via the bidirectional diode Db, a leakage current flowing in non-selecting resistive memory cells may be blocked.

Figure 6:
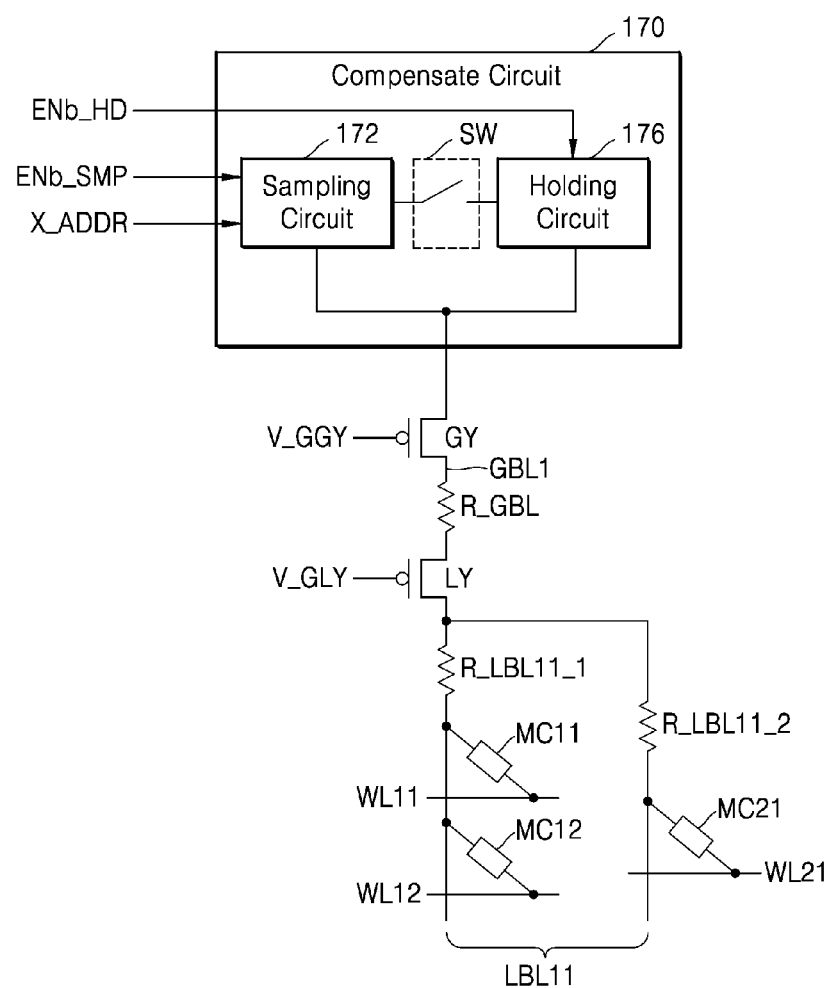
FIG. 6 is a diagram for illustrating and explaining operation of a compensation circuit, according to an example embodiment.

FIG. 6 is a diagram for illustrating and explaining operation of the compensation circuit, according to an example embodiment. FIG. 6 illustrates the compensate circuit 170 and memory cells MC11, MC12, and MC21 that are connected to the compensate circuit 170. In descriptions hereinafter, the operation of the compensate circuit 170 may be described based on an assumption that the memory cell 11 is the selected memory cell and the memory cells MC12 and MC21 are respectively non-selected memory cells.

Referring to FIG. 6, as the memory cell MC11 is a selected memory cell, the global bit line GBL1 and the local bit line LBL11 may be selected bit lines. The global bit line GBL1 may include a parasitic resistor R_GBL. The local bit line LBL11 may include parasitic resistors R_LBL11_1 and R_LBL11_2. Each of the global-selected transistor GY and the local-selected transistor LY may include a parasitic resistor.

A current (or voltage) to write and/or read data may be applied to the selected memory cell MC11 via the selected bit line, that is, the global bit line GBL1 and the local bit line LBL11. In this case, a leakage current (or a leakage voltage) may be unavoidably but undesirably applied to the non-selected memory cells MC12 and MC21.

In other words, due to the parasitic resistors of the global bit line GBL1, the local bit line LBL11, the global-selected transistor GY, and the local-selected transistor LY, and also due to the leakage current that is applied to the non-selected memory cells MC12 and MC21, a preset voltage (for example, the clamping voltage V_clamp) may not be regularly applied to the selected memory cell MC11. However, the compensate circuit 170 according to an example embodiment may regularly control voltages that are applied to all of the selected memory cells, by compensating for the voltage applied to the selected memory cell MC11 due to the parasitic resistors and the leakage current.

In detail, the compensate circuit 170 may include a sampling circuit 172 and a holding circuit 176. The compensate circuit 170 may include a switch, and the sampling circuit 172 and the holding circuit 176 may be connected to each other via the switch SW.

In an example embodiment, the sampling circuit 172 may generate a sampling value that is a value generated by sensing a leakage current that is applied to the non-selected memory cells MC12 and MC21, in response to the sampling-enable signal ENb_SMP and the row address X_ADDR. During a sampling operation of the sampling circuit 172, the switch SW may be turned on or off based on the sampling-enable signal. For example, during the sampling operation of the sampling circuit 172, the holding circuit 176 may be disabled in response to the holding-enable signal ENb_HD. However, the operations of the aforementioned circuits are not limited thereto.

In an example embodiment, the holding circuit 176 may receive the sampling value from the sampling circuit 172 in response to the holding-enable signal ENb_HD, hold the sampling value, and compensate for the voltage that is applied to the selected bit line, based on the sampling value that is held. The switch SW may be turned off during the holding and compensation operation of the holding circuit 176. For example, during the holding and compensation operation of the holding circuit 176, the sampling circuit 172 may be disabled in response to the sampling-enable signal ENb_SMP. However, the operations of the aforementioned circuits are not limited thereto.

Figure 7A:
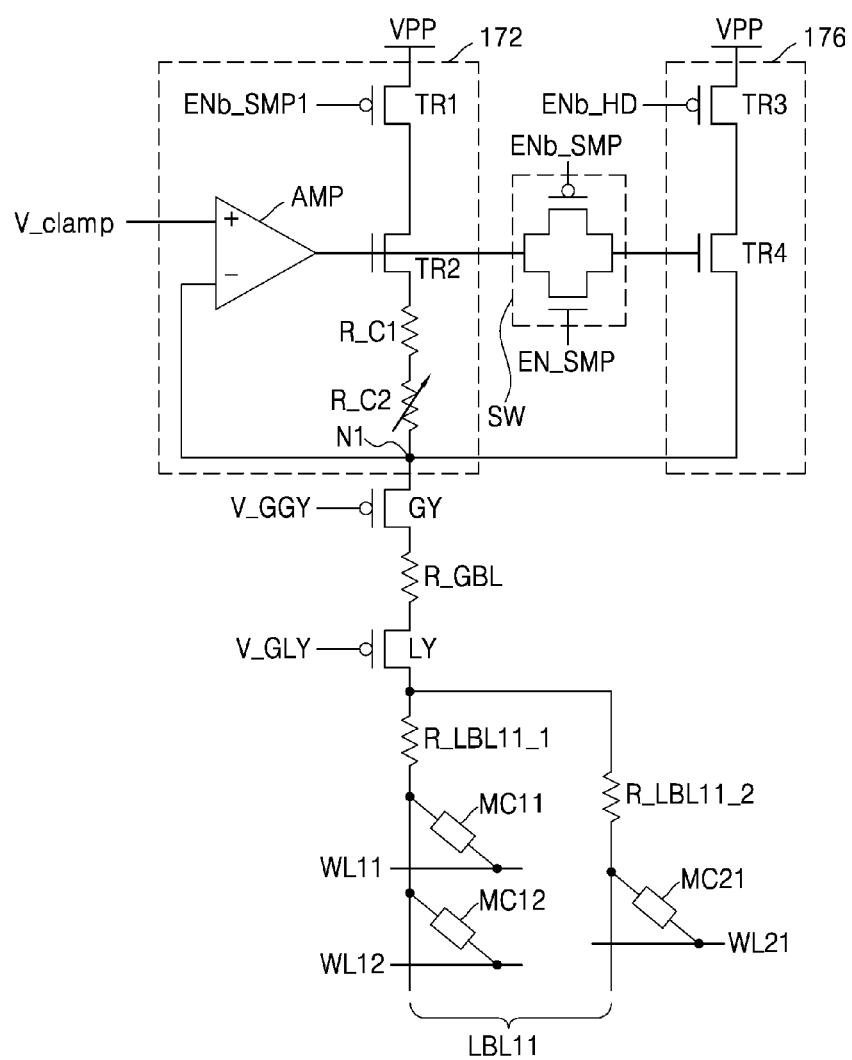
FIGS. 7A through 7D are diagrams for illustrating and explaining operations of the circuit diagram, according to example embodiments.
Figure 7B:
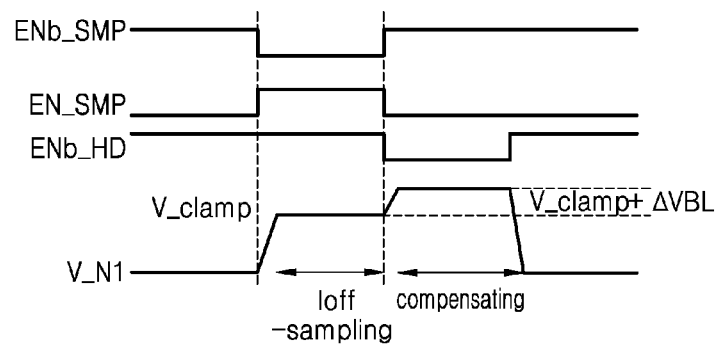
Figure 7C:
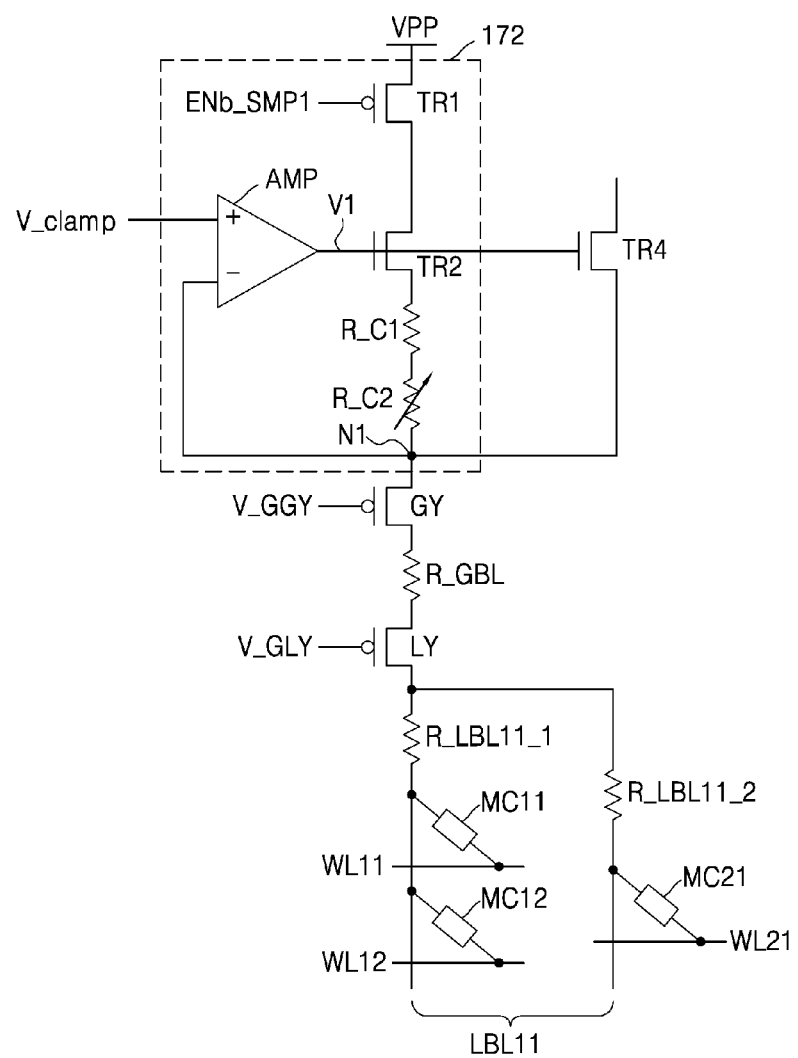
Figure 7D:
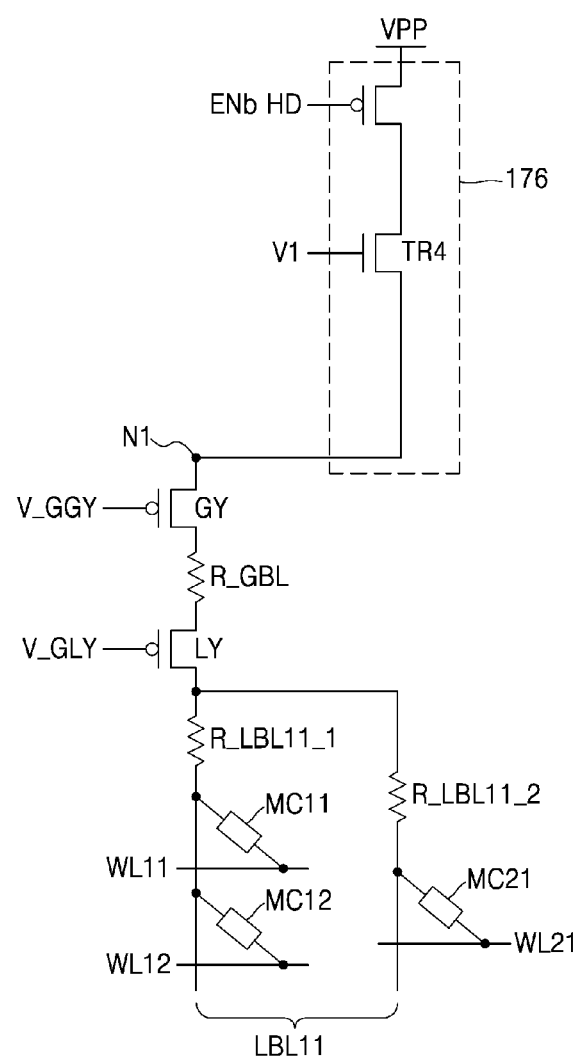

FIGS. 7A through 7D are diagrams for illustrating and explaining operations of the compensation circuit, according to an example embodiment. More particularly, FIG. 7A illustrates a diagram of the compensation circuit and the memory cells. FIG. 7B illustrates a timing diagram regarding signals that are applied to the compensation circuit. FIG. 7C illustrates an equivalent circuit of the compensation circuit during the sampling operation. FIG. 7D illustrates an equivalent circuit of the compensation circuit during the holding and compensation operation.

Referring to FIG. 7A, illustrated is an example of a detailed configuration of the sampling circuit 172 and the holding circuit 176 included in a compensation circuit, for example, the compensate circuit 170 (see FIG. 6). The sampling circuit 172 may include a first transistor TR1, a second transistor TR2, an amplifier AMP, a first resistor R_C1 and a second resistor R_C2. In this embodiment, the first resistor R_C1 is composed of one or more fixed resistor(s) and the second resistor R_C2 is composed of one or more variable resistor(s), but the present embodiment is not limited to this.

A power voltage VPP may be applied to an end of the first transistor TR1. A first signal, for example the sampling-enable signal ENb_SMP1, may be applied to a gate end of the first transistor TR1. In one example, the sampling-enable signal ENb_SMP1 may be the same signal as the sampling-enable signal ENb_SMP applied to the switch SW. As another example, the sampling-enable signal ENb_SMP1 may be a different signal from the sampling-enable signal ENb_SMP applied to the switch SW. The second transistor TR2 may be connected to the first transistor TR1 via a node. An end of the second transistor TR2 may be adjacent to and electrically connected to the first resistor R_C1, and electrically connected to the second resistor R_C2. A gate end of the second transistor TR2 may be connected to an output end of the amplifier AMP. A predetermined voltage, for example the clamping voltage V_clamp, may be applied to a positive input end (or a non-reverse input end) of the amplifier AMP. A negative input end (or a reverse input end) of the amplifier AMP may be connected to the second resistor R_C2. In addition, the output end of the amplifier AMP may be connected to a gate end of the second transistor TR2 and the switch SW.

The holding circuit 176 may include a third transistor TR3 and a fourth transistor TR4. The power voltage VPP may be applied to an end of the third transistor TR3. The holding-enable signal ENb_HD may be applied to a gate end of the third transistor TR3. The fourth transistor TR4 is connected to the third transistor TR3 via a node. An end of the fourth transistor TR4 is connected to the second resistor R_C2. A gate end of the fourth transistor TR4 may be connected to an end of the switch SW. The other end of the switch SW is connected to the gate end of the second transistor TR2 and the output end of the amplifier AMP as described above.

The switch SW may include a P-channel metal oxide semiconductor (PMOS) transistor and an N-channel metal oxide semiconductor (NMOS) transistor that are connected in parallel to each other. Each of the PMOS transistor and the NMOS transistor of the switch SW may receive the sampling-enable signal ENb_SMP and a complement-sampling enable signal EN_SMP. However, the aforementioned embodiment is simply an example and one of ordinary skill in the art will appreciate that the switch SW may be implemented by various configurations.

Referring further to FIG. 7B, during the sampling operation of the sampling circuit 172, the sampling-enable signal ENb_SMP and the complement-sampling enable signal EN_SMP may be activated. In addition, during the sampling operation of the sampling circuit 172, the holding-enable signal ENb_HD may be deactivated. In the embodiment, although the sampling-enable signal ENb_SMP and the holding-enable signal ENb_HD are described as being activated in logic low and the complement-sampling enable signal EN_SMP is described as being activated in logic high, the activation of the aforementioned signals is only an example and not limited thereto. For example, during the sampling operation of the sampling circuit 172, the unselect-word line voltage may be applied to the word lines WL.

Referring further to FIG. 7C, the third transistor TR3 is turned off during the sampling operation of the sampling circuit 172. Thus, a current may not be applied to the fourth transistor TR4. The switch SW may be turned on or off based on the sampling-enable signal. The amplifier AMP, the second transistor TR2, the first resistor R_C1, and the second resistor R_C2 form negative feedback. Thus, the clamping voltage V_clamp may be applied to the first node N1. In addition, when the leakage current applied to the non-selected memory cells MC12 and MC21 is referred to as Ioff, a gate voltage of the second transistor R2 may be expressed as in [Equation 1].

$$V1 = VN1 + \text{Ioff} \times (R\_C1 + R\_C2) + VGS_{T_P} \qquad [\text{Equation 1}]$$

As described above, VN1 equals to V_clamp, and VGS_TR2 may be a gate-source voltage of the second transistor TR2. In an example embodiment, a resistance of the first resistor R_C1 may be substantially the same as (equal to) a sum of a resistance of the global bit line GBL1, a resistance of the global-selected transistor GY, and a resistance of the local-selected transistor LY. In an example embodiment, a resistance of the second resistor R_C2 may be changed based on a row address, for example, the row address X_ADDR (see FIG. 2). For example, based on a row address, for example, the row address X_ADDR (see FIG. 2), the second resistor R_C2 may be changed to have a resistance that is substantially the same as the resistance of the local bit line LBL11.

In [Equation 1], the value of Ioff*(R_C1+R_C2) may be a sampling value that is calculated based on the leakage current that is applied to the non-selected memory cells MC12 and MC21. That is, the value of Ioff*(R_C1+R_C2) may be a sampling value that is generated by sampling the leakage current in the form of a voltage. In other words, the sampling value generated by the sampling circuit 172 may include information on (regarding) the leakage current, information on (regarding) the resistances of the global bit line GBL1 and the local bit line LBL11, and information on (regarding) the resistances of the global-selected transistor GY and the local-selected transistor LY. Therefore, the sampling value may include, reflect or be based on information on the leakage current, and/or information on a resistance value of the first resistor R_C1 and/or information on a resistance value of the second resistor R_C2.

Referring again to FIG. 7B, during the holding and compensation operation of the holding circuit 176, the holding-enable signal ENb_HD may be activated. In addition, during the holding and compensation operation of the holding circuit 176, the sampling-enable signal ENb_SMP and the complement-sampling enable signal EN_SMP may be deactivated.

Referring further to FIG. 7D, the first transistor TR1 is turned off during the holding and compensation operation of the holding circuit 176. Thus, currents may not be applied to the second transistor TR2, the first resistor R_C1, and the second resistor R_C2. The switch SW may be turned off. In this case, at the gate end of the fourth transistor TR4, a voltage V1 that is expressed in [Equation 1] may be maintained. For example, the gate voltage of the fourth transistor TR4 may be maintained as V1 when the voltage of V1 is applied to a gate capacitor of the fourth transistor TR4 during the sampling operation and the switch SW is therefore turned off during the holding and compensation operation. As another example embodiment, the holding circuit 176 may further include an additional capacitor connected to the gate end of the fourth transistor TR4 and ground.

As the third transistor TR3 is turned on and the gate voltage of the fourth transistor TR4 is maintained as V1, a voltage of the first node N1 may be expressed as in [Equation 2] below.

$$VN1 = \text{V\_clamp} + \textit{Ioff} \times (\text{R\_C1} + \text{R\_C2}) \quad \text{[Equation 2]}$$
$$= \text{V\_clamp} + \textit{Ioff} \times$$
$$(\text{R\_GBL1\_GY\_LY} + \text{R\_LBL11})$$
$$= \text{V\_clamp} + \Delta VBL$$

In other words, during the holding and compensation operation, the holding circuit 176 may output a voltage, which is calculated by compensating for the clamping voltage V_clamp with the sampling value, to the selected bit line, that is, the global bit line GBL1 and the local bit line LBL11. As a result, the compensate circuit 170 may compensate for the leakage current that is applied to the non-selected memory cells MC12 and MC21, the resistor R_GBL of the global bit line GBL1, the resistance of the global-selected transistor GY, the resistance of the local-selected transistor, and the resistance of the local bit line LBL11. The compensate circuit 170 may be operated such that the clamping voltage V_clamp is regularly applied to the selected memory cell MC11.

The memory device according to an example embodiment may, by including the compensate circuit 170, more accurately apply a target voltage (for example, the clamping voltage V_clamp) to the selected memory cell. In addition, by compensating for the leakage current caused by the non-selected memory cells, deviation between voltages to be respectively applied to the selected memory cells may be reduced. Accordingly, a resistance distribution of the resistive memory cells may be improved, which in turn improves stability of data stored in the resistive memory cells.

Figure 8:
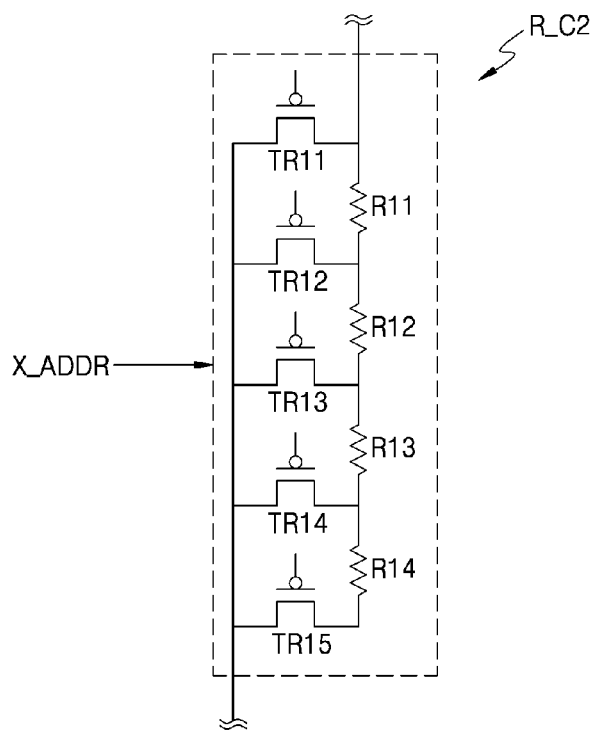
FIG. 8 is a circuit diagram illustrating an example of a detailed configuration of a second resistor shown in FIG. 7A.

FIG. 8 is a circuit diagram illustrating an example of a detailed configuration of the second resistor R_C2 shown in FIG. 7A.

Referring to FIG. 8, the second resistor R_C2 may include multiple transistors TR11 through TR15 and multiple resistive devices R11 through R14. Although the second resistor R_C2 is shown as including five transistors and four resistive devices, it is only for convenience of explanation and the embodiment is not limited thereto.

In an example embodiment, a resistance of the second resistor R_C2 may be changed based on the row address X_ADDR. For example, the transistors TR11 through TR15 may be turned on/turned off based on the row address X_ADDR. The second resistor R_C2 may, based on the row address X_ADDR, be changed to have a resistance that is substantially the same as the resistance of the local bit line corresponding to the row address X_ADDR.

Figure 9:
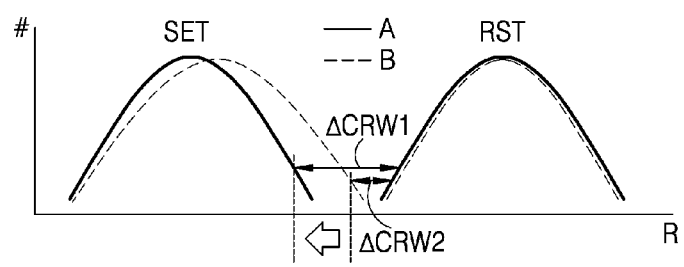
FIG. 9 illustrates resistance distribution of the memory cells in the memory device that includes the compensation circuit, according to an example embodiment.

FIG. 9 illustrates a graph of a resistance distribution of the memory cells in the memory device that includes the compensation circuit, according to an example embodiment.

Referring to FIG. 9, a distribution diagram indicating the number of cells for resistances is illustrated. The letter "A" designates a line showing a distribution of a case in which a compensation circuit (for example, the compensate circuit 170 in FIG. 1) is provided, and the letter "B" designates a line showing a distribution of a comparative example in which a compensation circuit is not provided. When a compensation circuit, for example, the compensate circuit 170 (see FIG. 1) is present, a gap ACRW1 between a set resistance distribution and a reset resistance distribution may be wider than a gap ACRW2 between a set resistance distribution and a reset resistance distribution. In other words, as the memory device may compensate for loss of the clamping voltage that is caused due to the leakage current applied to the non-selected memory cells, the resistances of the global bit lines and local bit lines, and the resistances of the global-selected transistors and the local-selected transistors, the resistance distribution of the memory cells may be improved. Accordingly, stability of data stored in the memory cells may be improved.

Figure 10:
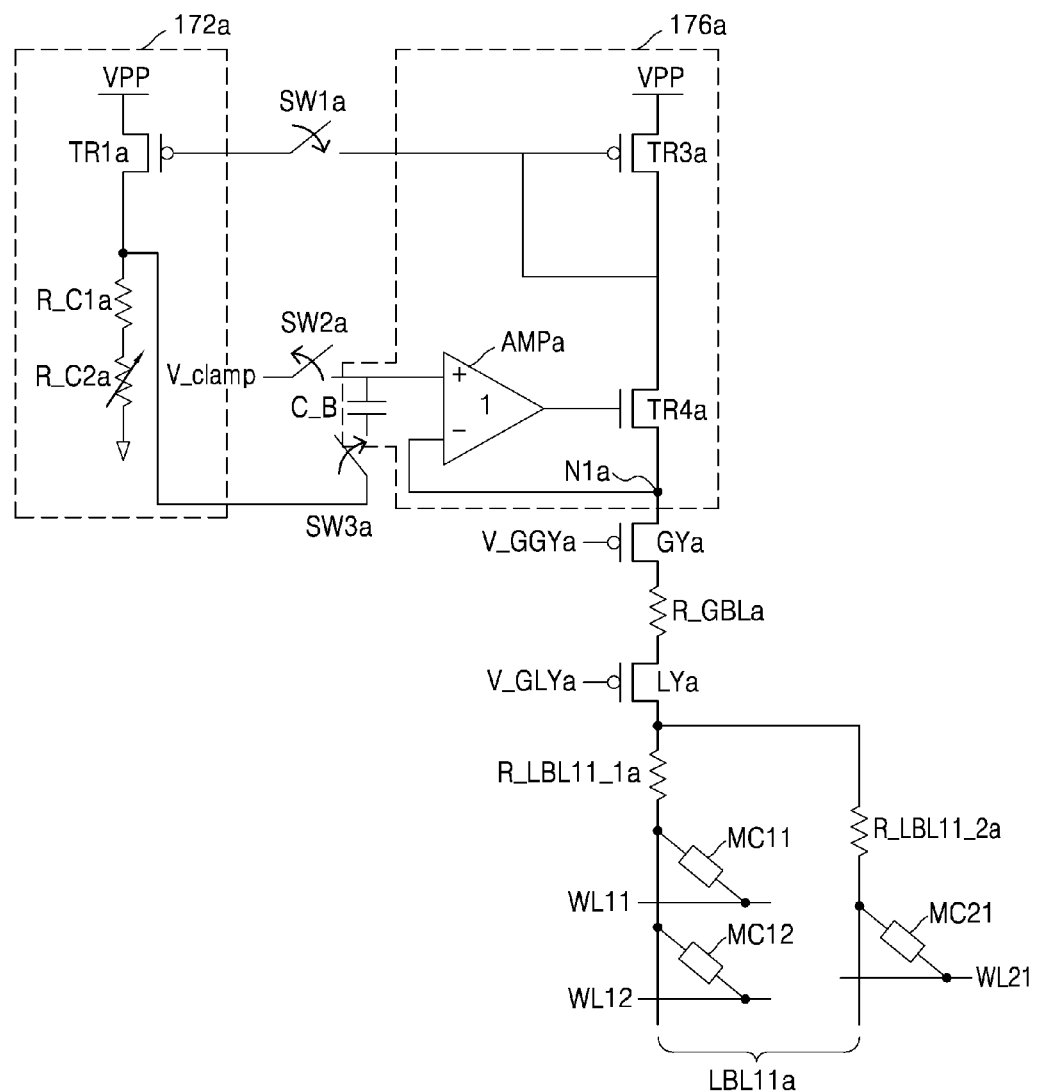
FIG. 10 is a diagram for illustrating and explaining operation of a compensation circuit, according to another example embodiment.

FIG. 10 is a diagram for illustrating and explaining operation of a compensation circuit, according to another example embodiment. With respect to configurations shown in FIG. 10, descriptions regarding the configuration overlapping with those of FIG. 7A will not be given.

Referring to FIG. 10, a sampling circuit 172a that is included in a compensation circuit, for example, the compensate circuit 170 (see FIG. 6), may include a first transistor TR1a, a first resistor R_C1a, and a second resistor R_C2a. The power voltage VPP may be applied to an end of the first transistor TR1a, and a first switch SW1a may be applied to a gate end of the first transistor TR1a. Another end of the first transistor TR1a may be connected to the first resistor R_C1a, and may also be connected to an end of a third switch SW3a having another end connected to a boosting capacitor C_B. The first resistor R_C1a and the second resistor R_C2a may be serially connected to each other.

A holding circuit 176a may be connected to the sampling circuit 172a via the first switch SW1a. The holding circuit 176a may include a third transistor TR3a, a fourth transistor TR4a, an amplifier AMPa, and the boosting capacitor C_B. The power voltage VPP is applied to an end of the third transistor TR3a. A gate end of the third transistor TR3a may be connected to an end of the first switch SW1a. The gate end of the third transistor TR3a may also be connected to another end (for example, a drain end) of the third transistor TR3a. That is, the third transistor TR3a has an end to which the power voltage VPP is applied, another end connected to the gate end of the third transistor TR3a, and the gate end is connected to an end of the first switch SW1a. An end of the fourth transistor TR4a may be connected to the gate end of the third transistor TR3a. Another end of the fourth transistor TR4a may be connected to a negative input end (or a reverse input end) of the amplifier AMPa. In addition, a gate end of the fourth transistor TR4a may be connected to an output end of the amplifier AMPa.

A positive input end (or a non-reverse input end) of the amplifier AMPa may be connected to an end of the second switch SW2a having another end to which the (predetermined) clamping voltage V_clamp is applied. In addition, the positive input end (or the non-reverse input end) of the amplifier AMPa may be connected to an end of the boosting capacitor C_B having another end that is connected to the third switch SW3a.

In an example embodiment, before the sampling operation of the sampling circuit 172a, the first switch SW1a and the third switch SW3a may be turned off, and the second switch SW2a may be turned on. Next, during the sampling operation of the sampling circuit 172a, the first switch SW1a may be turned on based on the sampling-enable signal, and the second switch SW2a may be turned off based on the sampling-enable signal. As the first switch SW1a is turned on, the first transistor TR1a and the third transistor TR3a may form a current-mirror. In addition, as a voltage of the first node N1a, the clamping voltage V_clamp may be applied, based on sound feedback of the amplifier AMPa and the fourth transistor TR4a. Accordingly, during the sampling operation, the leakage current applied to the non-selected memory cells MC12 and MC21 may be copied through the current-mirror and applied to the first resistor R_C1a and the second resistor R_C2a. Accordingly, a voltage applied to the first resistor R_C1a and the second resistor R_C2a may be expressed as [Equation 3] below.

$$V = Ioff \times (R\_C1a + R\_C2a) \qquad \text{[Equation 3]}$$

In an example embodiment, a resistance of the first resistor R_C1a may be substantially the same as (equal to) a sum of a resistance of a global bit line GBL1a, a resistance of a global-selected transistor GYa, and a resistance of a local-selected transistor LYa. In an example embodiment, a resistance of the second resistor R_C2a may be changed based on a row address, for example, the row address X_ADDR (see FIG. 2). For example, based on a row address, for example, the row address X_ADDR (see FIG. 2), the second resistor R_C2a may be changed to have a resistance that is substantially the same as a resistance of the local bit line LBL11a.

Next, during the holding and compensation operation of the holding circuit 176a, the third switch SW3a may be turned on. As the third switch SW3a is turned on, the boosting capacitor C_B is boosted. Thus, a voltage that is applied to the positive input end of the amplifier AMPa and the first node N1a may be expressed as [Equation 4] below.

$$\begin{aligned} VN1a &= V\_clamp + Ioff \times (R\_C1a + R\_C2a) \qquad \text{[Equation 4]} \\ &= V\_clamp + Ioff \times \\ &\quad (R\_GBL1a\_GYa\_LYa + R\_LBL11a) \\ &= V\_clamp + \Delta VBL \end{aligned}$$

In other words, during the holding and compensation operation, the holding circuit 176a may output a voltage that is calculated by compensating for the clamping voltage V_clamp with the sampling value. The voltage is output to the selected bit line, that is, the global-selected bit line GBL1a and the local-selected bit line LBL11a.

Figure 11:
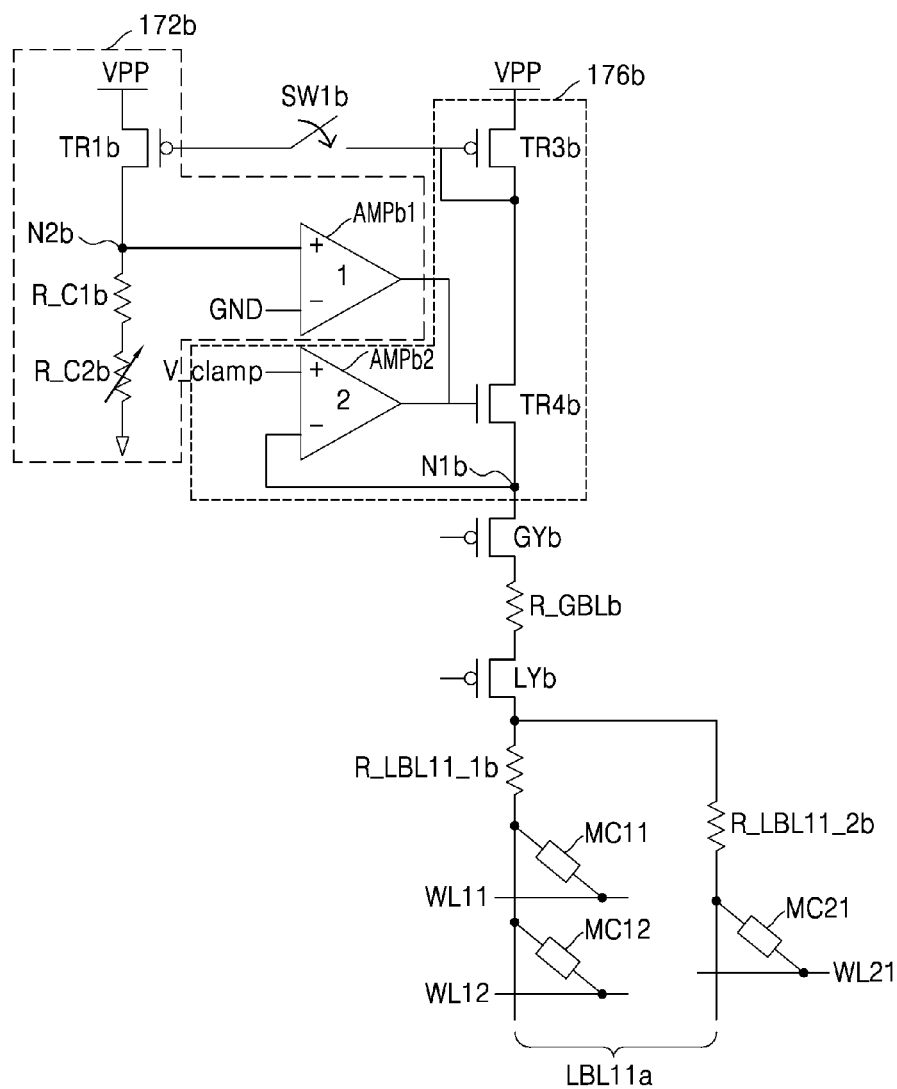
FIG. 11 is a diagram for illustrating and explaining operation of a compensation circuit, according to another example embodiment.

FIG. 11 is a diagram for illustrating and explaining operation of a compensation circuit, according to another example embodiment. Among configurations shown in FIG. 11, descriptions regarding the configurations overlapping with those of FIG. 7A will not be given.

Referring to FIG. 11, a sampling circuit 172b included in a compensation circuit, for example, the compensate circuit 170 (see FIG. 6), may include a first transistor TR1b, a first resistor R_C1b, a second resistor R_C2b, and a first amplifier AMPb1. The first transistor TR1b may have an end (a first end) and another end (a second end). The power voltage VPP is applied to the end of the first transistor TR1b, and a first switch SW1b may be applied to a gate end of the first transistor TR1b. The other end of the first transistor TR1b may be connected to the first resistor R_C1b, and may also be connected to a positive input end (or a non-reverse input end) (referred to as a second node N2b hereinafter) of the first amplifier AMPb1. The first resistor R_C1b and the second resistor R_C2b may be serially connected to each other.

A holding circuit 176b may be connected to the sampling circuit 172b via the first switch SW1b. The holding circuit 176a may include a third transistor TR3b, a fourth transistor TR4b, and a second amplifier AMPb2. The power voltage VPP may be applied to an end of the third transistor TR3b. A gate end of the third transistor TR3b may be connected to an end of the first switch SW1b. The gate end of the third transistor TR3b may also be connected to another end (for example, a drain end) of the third transistor TR3b. An end of the fourth transistor TR4b may be connected to the gate end of the third transistor TR3b, and another end of the fourth transistor TR4b may be connected to a negative input end (or a reverse input end) of the second amplifier AMPb2. In addition, the gate end of the fourth transistor TR4b may be connected to output ends of the first amplifier AMPb1 and the second amplifier AMPb2.

A ground voltage GND may be applied to a negative input end (or a reverse input end) of the first amplifier AMPb1. The clamping voltage V_clamp may be applied to a positive input end (or a non-reverse input end) of the second amplifier AMPb2.

In an example embodiment, the sampling operation and the holding and compensation operation may be simultaneously performed. More particularly, during the sampling operation (or during the holding and compensation operation), the first switch SW1b may be turned on based on the sampling-enable signal. As the first switch SW1b is turned on, the first transistor TR1b and the third transistor TR3b may form a current-mirror. Accordingly, the leakage current that is applied to the non-selected memory cells MC12 and MC21 are applied to the first resistor R_C1b and the second resistor R_C2b via the current-mirror. Thus, a voltage of the second node N2b may be expressed as [Equation 5] below.

$$VN2b = Ioff \times (R\_C1b + R\_C2b) \qquad \text{[Equation 5]}$$

When the voltage of the second node N2b is expressed as [Equation 5] and open loop gains of the first amplifier AMPb1 and the second amplifier AMPb2 are respectively A1 and A2, the voltage of the first node N1b may be expressed as [Equation 6] below.

$$\begin{aligned} VN1b &= V\_clamp + \left(\frac{A1}{A2}\right) \times Ioff \times (R\_C1b + R\_C2b) \qquad \text{[Equation 6]} \\ &= V\_clamp + \left(\frac{A1}{A2}\right) \times Ioff \times \\ &\quad (R\_GBL1b\_GYb\_LYb + R\_LBL11b) \\ &= V\_clamp + \Delta VBL \end{aligned}$$

In the embodiment, the first amplifier AMPb1 and the second amplifier AMPb2 may be referred to as mixers. For example, A1 and A2, which are open loop gains, may be substantially equal to each other. However, A1 and A2 are not limited thereto; as another example, A1 and A2 may be different from each other. Accordingly, during the sampling operation (or during the holding and compensation operation), the holding circuit 176 may output a voltage that is generated by compensating for the clamping voltage V_clamp with the sampling value, to the selected bit line, that is, a global-selected bit line GBL1b and a local-selected bit line LBL11.

Figure 12:
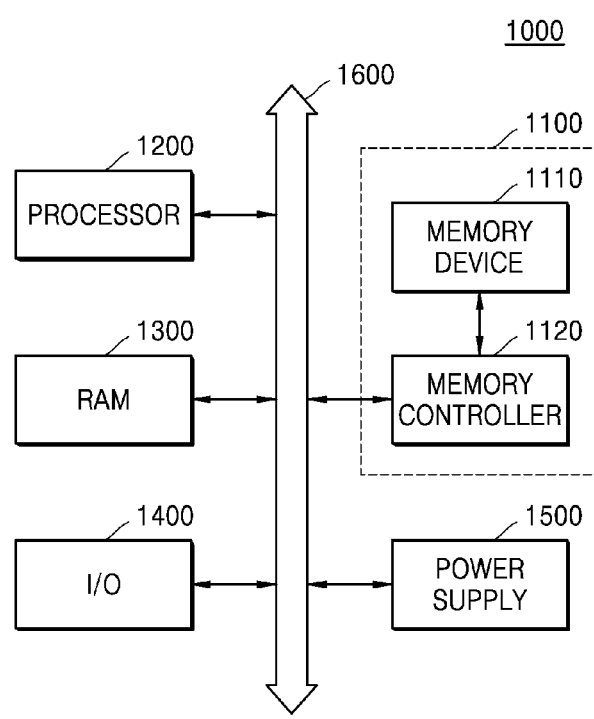
FIG. 12 is a block diagram illustrating a computing system including a memory system, according to example embodiments.

FIG. 12 is a block diagram illustrating a computing system including a memory system, according to example embodiments.

Referring to FIG. 12, a computing system 1000 may include a memory system 1100, a processor 1200, RAM 1300, an input/output device 1400, and a power supply 1500. Although not illustrated in FIG. 12, the computing system 1000 may further include ports that may communicate with a video card, a sound card, a memory card, a USB device, or other electronic devices. The computing system 1000 may be implemented as a personal computer or a mobile electronic device, for example, a notebook computer, a mobile phone, a personal digital assistant (PDA), a camera, and the like.

The processor 1200 may perform particular operations or tasks. According to embodiments, the processor 1200 may be a microprocessor or a central processing unit (CPU). The processor 1200 may communicate with the RAM 1300, the input/output device 1400, and the memory system 1100, by using a bus 1600 including an address bus, a control bus, a data bus, and the like. In this case, the memory system 1100 may be implemented according to the embodiments described in FIGS. 1 through 11.

According to embodiments, the processor 1200 may also be connected to an extension bus such as a Peripheral Component Interconnect (PCI) bus.

The RAM 1300 may store data required for operations of the computing system 1000. For example, the RAM 1300 may be implemented as dynamic random-access memory (DRAM), mobile DRAM, static RAM (SRAM), phase-change RAM (PRAM), ferroelectrics RAM (FRAM), resistive RAM (RRAM), and/or magnetic RAM (MRAM).

The input/output device 1400 may include components for input, for example, a keyboard, a keypad, and a mouse, and the like, and components for output, for example, a printer, a display, and the like. The power supply 1500 may provide a dynamic voltage that is required for operations of the computing system 1000.

Example embodiments have been described in the accompanying drawings and throughout the specification. While the inventive concept(s) of the present disclosure has/have been particularly shown and described with reference to embodiments thereof, the embodiments are considered in a descriptive sense only and not for limitation. One of ordinary skill in the art will readily appreciate that various modifications and other equivalent embodiments are possible. Accordingly, the true technical scope of the inventive concept(s) described herein is/are defined by the technical spirit of the appended claims.

What is claimed is:

1. A memory device, comprising:
   a memory cell array comprising a plurality of memory cells;
   a plurality of bit lines, wherein each of the plurality of bit lines is connected to at least one of the plurality of memory cells, and among the plurality of bit lines, a predetermined voltage is applied to selected bit lines that are connected to selected memory cells;
   a compensation circuit comprising a sampling circuit that generates a sampling value by sensing a leakage current that is applied to non-selected memory cells from among the plurality of memory cells, and a holding circuit that compensates for voltages applied to the selected bit lines, based on the sampling value; and
   a control logic circuit that outputs a sampling-enable signal that controls enabling of the sampling circuit and a holding-enable signal that controls enabling of the holding circuit.

2. The memory device of claim 1, wherein
   the compensation circuit further comprises a switch that has an end connected to the sampling circuit and another end connected to the holding circuit and being controlled to be turned on or off based on the sampling-enable signal.

3. The memory device of claim 2, wherein
   the switch is, in response to the sampling-enable signal, turned on when the sampling circuit is enabled.

4. The memory device of claim 1, wherein
   each of the plurality of bit lines comprises a global bit line and at least one local bit line that is electrically connected to the global bit line via a local-selected transistor,
   wherein the global bit line is electrically connected to the sampling circuit via a global-selected transistor, and the at least one local bit line is electrically connected to at least one of the plurality of memory cells.

5. The memory device of claim 4, wherein
   the control logic circuit further outputs a row address for the memory cell array, based on an address received from outside the memory device,
   the sampling circuit further comprises a first resistor and a second resistor that are serially connected to each other, and
   a resistance of the second resistor is changed based on the row address.

6. The memory device of claim 5, wherein
   the first resistor comprises a resistance that is substantially equal to a sum of a resistance of the global bit line, a resistance of the local-selected transistor, and a resistance of the global-selected transistor.

7. The memory device of claim 5, wherein
   the sampling circuit comprises:
   a first transistor having an end to which a power voltage is applied and a gate end to which a first signal is applied;
   a second transistor connected to the first transistor via a node and having an end that is electrically connected to the first resistor and the second resistor; and
   an amplifier having a positive input end to which the predetermined voltage is applied, a negative input end connected to the second resistor, and an output end connected to a gate end of the second transistor.

8. The memory device of claim 7, wherein
   the first transistor is turned on as the first signal is activated, and as the first transistor is turned on, the sampling circuit delivers the sampling value to the holding circuit.

9. The memory device of claim 7, wherein
   the holding circuit comprises:
   a third transistor having an end to which the power voltage is applied and a gate end to which the holding-enable signal is applied; and
   a fourth transistor connected to the third transistor via a node and having a gate end connected to an end of a switch that has another end connected to an output end of the amplifier and an end is electrically connected to the first resistor and the second resistor.

10. The memory device of claim 5, wherein
    the sampling circuit comprises a first transistor having an end to which a power voltage is applied and another end that is electrically connected to the first resistor and the second resistor.

11. The memory device of claim 10, wherein
    the holding circuit comprises:
    a third transistor comprising an end to which the power voltage is applied, a gate end, and another end connected to the gate end, wherein the gate end is connected to an end of a first switch having another end connected to a gate end of the first transistor;
    a fourth transistor having an end connected to the gate end of the third transistor;

an amplifier having a positive input end connected to an end of a second switch having another end to which the predetermined voltage is applied, a negative input end connected to another end of the fourth transistor, and an output end connected to a gate end of the fourth transistor; and a boosting capacitor connected between an end of a third switch having another end electrically connected to the first resistor and the second resistor, and the positive input end of the amplifier.

12. The memory device of claim 5, wherein the sampling circuit comprises:

a first transistor having an end to which a power voltage is applied and another end connected to the first resistor; and a first amplifier having a positive input end connected to another end of the first transistor, a negative input end to which a ground voltage is applied, and an output end connected to the holding circuit.

13. The memory device of claim 12, wherein the holding circuit comprises:

a third transistor comprising an end to which the power voltage is applied, a gate end and another end connected to the gate end, wherein the gate end is connected to an end of a first switch having another end connected to a gate end of the first transistor;

a fourth transistor having an end connected to the gate end of the third transistor and a gate end connected to the output end of the first amplifier; and a second amplifier having a positive input end to which the predetermined voltage is applied, a negative input end connected to another end of the fourth transistor, and an output end connected to the gate end of the fourth transistor.

14. A resistive memory device, comprising:

a memory cell array comprising a plurality of word lines, a plurality of bit lines, and a plurality of memory cells;

a control logic circuit that outputs a row address for the plurality of word lines, based on an address received from an external device; and a compensation circuit comprising a sampling circuit that generates a sampling value by sensing a leakage current that is applied to bit lines connected to selected memory cells on which memory operations are performed, from among the plurality of memory cells, a holding circuit that holds the sampling value and compensates, based on the sampling value, for voltages that are applied to the bit lines connected to the selected memory cells, and a switch having an end connected to the sampling circuit and another end connected to the holding circuit.

15. The resistive memory device of claim 14, wherein the control logic circuit further outputs a sampling-enable signal that controls enabling of the sampling circuit, and the switch is turned on or off based on the sampling-enable signal.

16. The resistive memory device of claim 14, wherein each of the plurality of bit lines comprises a global bit line and at least one local bit line that is electrically connected to the global bit line via a local-selected transistor, and the global bit line is electrically connected to the compensation circuit via a global-selected transistor, and the at least one local bit line is connected to at least one of the plurality of memory cells.

17. The resistive memory device of claim 16, wherein the sampling circuit further comprises a first resistor that has a resistance substantially equal to a sum of a resistance of the global bit line, a resistance of the local-selected transistor, and a resistance of the global-selected transistor.

18. The resistive memory device of claim 17, wherein the sampling circuit further comprises a second resistor that is serially connected to the first resistor and has a resistance that is changed based on the row address.

19. A resistive memory device, comprising:

a memory cell array comprising a plurality of memory cells arranged in rows and columns;

bit lines comprising a plurality of local bit lines respectively connected to the plurality of memory cells and a plurality of global bit lines connected to at least one of the plurality of local bit lines via a local-selected transistor; and a compensation circuit comprising a sampling circuit that generates a sampling value by sensing a leakage current that is applied to bit lines connected to selected memory cells on which memory operations are performed, and a holding circuit that compensates for a voltage applied to the bit lines that are connected to the selected memory cells, based on the sampling value.

20. The resistive memory device of claim 19, wherein the plurality of global bit lines are each electrically connected to the sampling circuit via a global-selected transistor, the sampling circuit further comprises a first resistor that has a resistance substantially equal to a sum of a resistance of the global bit line included in a bit line connected to the selected memory cell, a resistance of the local-selected transistor, and a resistance of the global-selected transistor, wherein the sampling value comprises at least one of information on the leakage current and information on a resistance value of the first resistor.

* * * * *